(12) United States Patent
Tian et al.

(10) Patent No.: US 12,405,225 B2
(45) Date of Patent: Sep. 2, 2025

(54) LIFTER ASSEMBLY WITH BELLOWS FOR OPTICAL INSPECTION SYSTEM

(71) Applicant: KLA Corporation, Milpitas, CA (US)

(72) Inventors: Lim Chow Tian, Sg (SG); Rajeev Patil, Fremont, CA (US); Jinson Jayan, Sg (SG)

(73) Assignee: KLA CORPORATION, Milpitas, CA (US)

( * ) Notice: Subject to any disclaimer, the term of this patent is extended or adjusted under 35 U.S.C. 154(b) by 385 days.

(21) Appl. No.: 18/120,765

(22) Filed: Mar. 13, 2023

(65) Prior Publication Data

US 2024/0183790 A1 Jun. 6, 2024

Related U.S. Application Data

(60) Provisional application No. 63/430,412, filed on Dec. 6, 2022.

(51) Int. Cl.
*G01N 21/95* (2006.01)
*B25B 11/00* (2006.01)
(Continued)

(52) U.S. Cl.
CPC ........ *G01N 21/9501* (2013.01); *B25B 11/005* (2013.01); *B66F 3/24* (2013.01); *H01L 21/68742* (2013.01)

(58) Field of Classification Search
CPC ......... H01L 21/68742; H01L 21/68764; H01L 21/687; H01L 21/683; H01L 21/673;
(Continued)

(56) References Cited

U.S. PATENT DOCUMENTS 6,271,676 B1 * 8/2001 Montoya ............. H01L 21/6838
279/3
6,827,789 B2 * 12/2004 Lee ................... H01L 21/68785
118/729
(Continued)

FOREIGN PATENT DOCUMENTS

JP          2013104667 A    5/2013
KR          102251891 B1    5/2021
KR          20210116003 A   9/2021

OTHER PUBLICATIONS

International Search Report and Written Opinion regarding corresponding PCT App. No. PCT/US2023/082244; mailed Apr. 2, 2024.

*Primary Examiner* — Peter J Macchiarolo
(74) *Attorney, Agent, or Firm* — DICKINSON WRIGHT PLLC (57) ABSTRACT

A lifter assembly for an optical system includes a chuck having a chuck base and a detachable top plate, wherein the detachable top plate is one of a plurality of interchangeable detachable top plates configured to support a substrate. The lifter assembly also includes a moveable plate supporting the chuck on an upper surface of the moveable plate, the moveable plate vertically adjustable between a lower, retracted position and an upper, extended position. The lifter assembly further includes a bellows structure operatively coupled to the moveable plate. The lifter assembly yet further includes a pneumatic system fluidly coupled to the bellows structure to selectively expand and contract, wherein expansion of the bellows structure vertically adjusts the moveable plate to the upper, extended position and contraction of the bellows structure vertically adjusts the moveable plate to the lower, retracted position.

16 Claims, 8 Drawing Sheets

(51) Int. Cl.
*B66F 3/24* (2006.01)
*H01L 21/687* (2006.01)

(58) Field of Classification Search
CPC ............... H01L 21/67; H01L 21/68714; H01L 21/6838; H01L 21/68771
See application file for complete search history.

(56) References Cited

U.S. PATENT DOCUMENTS

| | | | |
|---|---|---|---|
| 9,226,407 B2 * | 12/2015 | Zhang | B23K 3/08 |
| 9,960,070 B2 * | 5/2018 | Huang | H01L 21/68785 |
| 10,468,288 B2 * | 11/2019 | Balan | H01L 21/67288 |
| 11,742,235 B2 * | 8/2023 | Schaller | H01L 21/68785 |
| | | | 414/217 |
| 2002/0104453 A1 * | 8/2002 | Lee | G03F 7/70816 |
| | | | 101/450.1 |
| 2019/0001433 A1 * | 1/2019 | Yamamoto | B23K 26/032 |
| 2020/0105573 A1 | 4/2020 | Schaller et al. | |
| 2022/0268808 A1 | 8/2022 | Borchers | |
| 2023/0069384 A1 * | 3/2023 | Tian | G01N 21/9501 |
| 2023/0207369 A1 * | 6/2023 | Lee | H01L 21/6833 |
| | | | 279/128 |

* cited by examiner

LIFTER ASSEMBLY WITH BELLOWS FOR OPTICAL INSPECTION SYSTEM

CROSS-REFERENCE TO RELATED APPLICATION

This application claims priority to U.S. Provisional Application No. 63/430,412, filed Dec. 6, 2022, the disclosure of which is incorporated by reference herein in its entirety.

FIELD OF THE INVENTION

The embodiments described herein relate to optical inspection systems and, more particularly, to a pneumatic lifter assembly for such systems.

BACKGROUND

Inspection processes are used at various steps during a semiconductor manufacturing process to detect defects on wafers to promote higher yield in the manufacturing process, thereby obtaining higher profits. Inspection has always been an important part of fabricating semiconductor devices. However, as the dimensions of semiconductor devices decrease, inspection becomes even more important to the successful manufacture of acceptable semiconductor devices since smaller defects can cause the devices to fail.

Some fabrication, metrology and defect inspection processes require vertical movement of a chuck on which a substrate is positioned on a top surface of A lifter assembly supports the chuck and actuates the vertical movement. For example, a pneumatic rod may be located within a chamber of the lifter assembly and connected to support features and a movable plate to carry out the vertical movement of the chuck with the introduction and removal of a fluid. Some tools that the lifter assembly works in conjunction with may offer limited space to accommodate the overall lifter assembly features during operation. The aforementioned pneumatic rod occupies more space when the lifter assembly is extended away from a retracted (i.e., down) position to an upward position. Furthermore, the pneumatic rod may not be able to maintain perpendicularity to the support features it is adjacent to when an uneven load is being lifted or applied, thereby resulting in wear inside the bore within which the rod slides. Finally, a pneumatic rod is only capable of extending to a fixed stroke length that is not adjustable.

The above-described issues pose challenges to the inspection process of substrates.

SUMMARY OF THE DISCLOSURE

According to one aspect of the disclosure, a lifter assembly for an optical system includes a chuck having a chuck base and a detachable top plate, wherein the detachable top plate is one of a plurality of interchangeable detachable top plates configured to support a substrate. The lifter assembly also includes a moveable plate supporting the chuck on an upper surface of the moveable plate, the moveable plate vertically adjustable between a lower, retracted position and an upper, extended position. The lifter assembly further includes a bellows structure operatively coupled to the moveable plate. The lifter assembly yet further includes a pneumatic system fluidly coupled to the bellows structure to selectively expand and contract, wherein expansion of the bellows structure vertically adjusts the moveable plate to the upper, extended position and contraction of the bellows structure vertically adjusts the moveable plate to the lower, retracted position.

According to another aspect of the disclosure, an optical system includes a substrate chucking sub-system having a chuck having a chuck base and a detachable top plate, the detachable top plate configured to support a substrate. The optical system also includes a moveable plate supporting the chuck on an upper surface of the moveable plate, the moveable plate vertically adjustable between a lower, retracted position and an upper, extended position. The optical system further includes a bellows structure operatively coupled to the moveable plate, wherein expansion of the bellows structure vertically adjusts the moveable plate to the upper, extended position and contraction of the bellows structure vertically adjusts the moveable plate to the lower, retracted position. The optical system yet further includes an illumination source configured to illuminate one or more portions of the substrate. The optical system also includes a detector configured to collect illumination from the illuminated one or more portions of the substrate.

According to yet another aspect of the disclosure, a lifter assembly for vertically repositioning a substrate includes a vacuum chuck configured to support the substrate and hold the substrate with vacuum air pressure. The lifter assembly also includes a moveable plate supporting the vacuum chuck on an upper surface of the moveable plate, the moveable plate vertically adjustable between a lower, retracted position and an upper, extended position. The lifter assembly further includes a welded bellows structure operatively coupled to the moveable plate, wherein expansion of the welded bellows structure vertically adjusts the moveable plate to the upper, extended position and contraction of the bellows structure vertically adjusts the moveable plate to the lower, retracted position.

These aspects and other advantages and features are apparent from the following description taken in conjunction with the drawings.

BRIEF DESCRIPTION OF THE DRAWINGS

The subject matter that is regarded as embodiments of the invention is particularly pointed out and distinctly claimed in the claims at the conclusion of the specification. The features and advantages of the disclosed embodiments are apparent from the following detailed description taken in conjunction with the accompanying drawings in which:

DETAILED DESCRIPTION

Referring to the Figures, where the invention will be described with reference to specific embodiments, it is to be understood that the disclosed embodiments are merely examples of the invention that may be embodied in various and alternative forms. The Drawings are not necessarily to scale, as some features may be exaggerated, reduced or simplified to show details of particular components. Therefore, specific structural and functional details disclosed herein and illustrated in the Drawings are not to be interpreted as limiting, but merely as a representative basis for teaching one skilled in the art to variously employ the invention.

Figure 1:
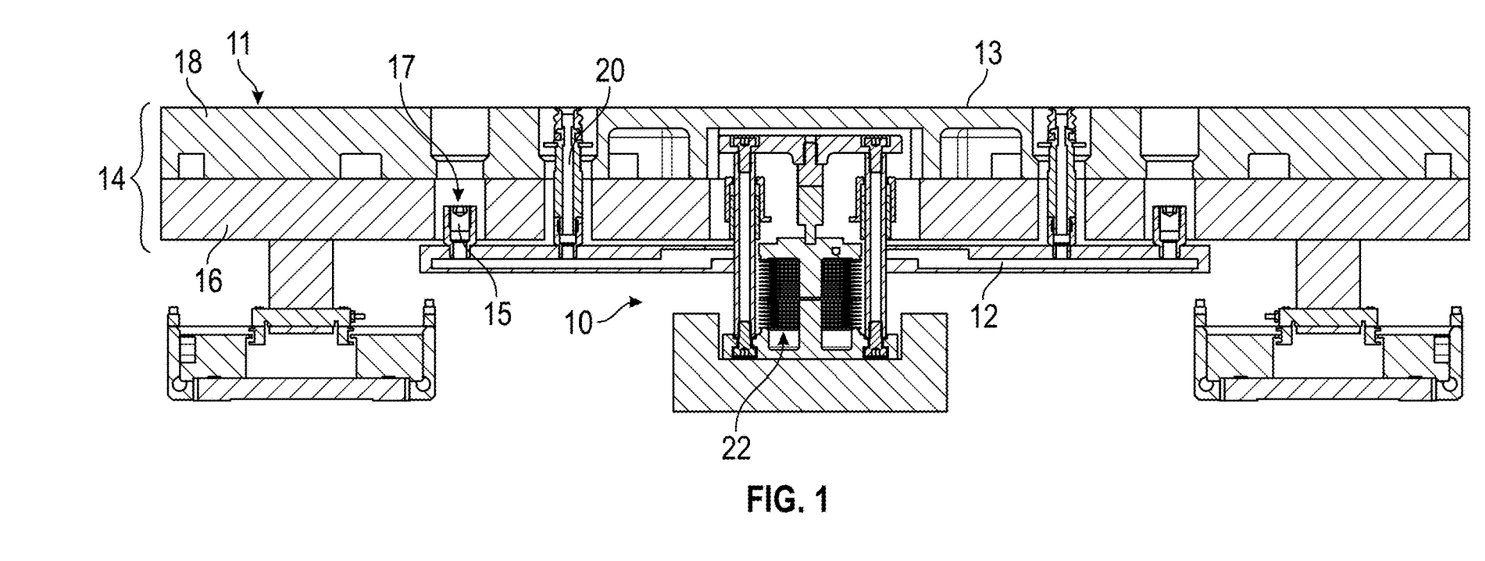
FIG. 1 is a partial cross-sectional, elevation view of an optical inspection system lifter assembly supporting a chuck.

Referring to FIG. 1, a portion of a substrate chucking system for an optical system is shown and generally referenced with numeral 11. Embodiments of a lifter assembly 10 are disclosed herein to support and vertically adjust a chuck 14. The lifter assembly 10 includes a moveable plate 12 which supports the chuck 14. The chuck 14 is configured to support a substrate, such as a semiconductor wafer (not shown), for example. Various types of contemplated chucks may be used with the lifter assembly 10 disclosed herein. By way of non-limiting example, the lifter assembly 10 may be used with the substrate chucking system disclosed in U.S. patent application Ser. No. 17/562,544, the disclosure of which is incorporated by reference herein in its entirety. In the illustrated embodiment, the chuck 14 is a vacuum chuck that holds the substrate in place on a top surface 13 of the chuck 14 with vacuum air pressure routed through the chuck 14 via one or more vacuum inlets 15 and vacuum reservoirs 17. Additionally, in the illustrated embodiment, the chuck 14 includes a chuck base 16 and a detachable plate 18. The detachable plate 18 is secured to the chuck base 16 with one or more fasteners or guides 20. However, it is to be understood that it is within the scope of the disclosed embodiments to have a single structure chuck 14.

The chuck base 16 is structured to advantageously allow different types of the detachable plates 18 to be secured thereon. The detachable plate 18 is suitable for quick interchange on the chuck base 16. Such a configuration is more time and cost efficient in the substrate chuck interchanging process, as it allows for a common chuck base to accommodate multiple top plates used for a variety of substrates.

Regardless of the specific type of chuck, overall tool/stage and optical system, the embodiments of the lifter assembly 10 disclosed herein include a bellows structure 22 that actuates substantially vertical movement of the moveable plate 12 and therefore the chuck 14 and substrate supported thereon. The bellows structure 22 is a welded bellows type in some embodiments. The bellows structure 22 is formed in an accordion structure so that a plurality of annular bellows plates having radially curved surfaces are connected in an alternating manner on the outside-diameter side and the inside-diameter side. The bellows plates are connected together by TIG welding or the like in the atmosphere or an Ar gas environment, for example. The bellows structure 22 defines a hollow interior chamber.

Vertical adjustment of the moveable plate 12 alters a distance between the chuck 14—with the substrate held thereon—and a measurement device of the optical system. As used herein, the term "measurement device" is generally used to refer to a metrology device, an inspection device, or a combination metrology and inspection device. Vertical adjustment of the moveable plate 12, chuck 14 and substrate facilitates various actions by the optical system.

Figure 2:
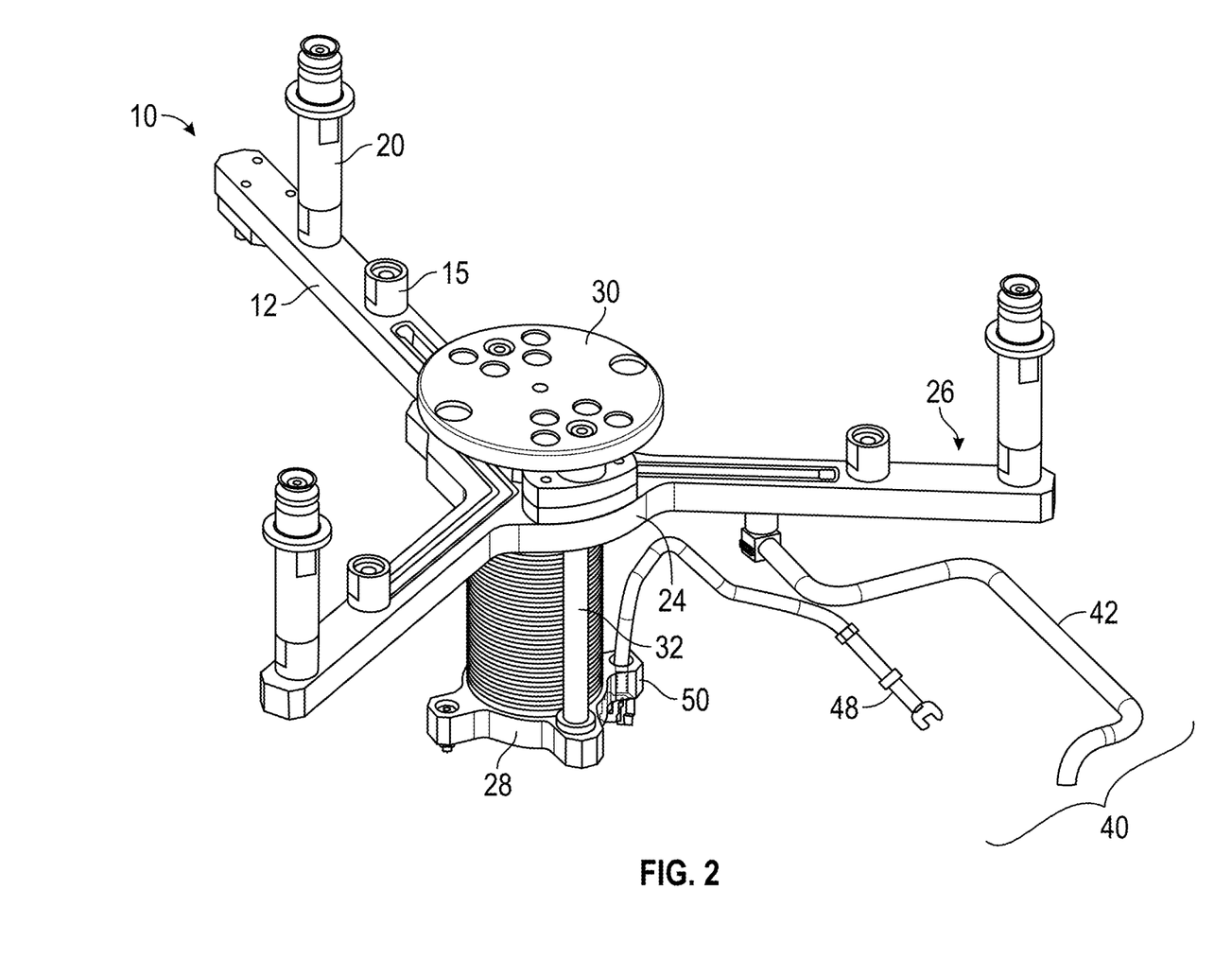
FIG. 2 is a perspective view of the lifter assembly.

Referring now to FIG. 2, the lifter assembly 10 is shown in additional detail. As shown, the fasteners and guides 20 are radially outward of the vacuum inlets 15 in the illustrated embodiment, which is the opposite configuration to that shown in FIG. 1. Accordingly, it is to be appreciated that either configuration is contemplated.

The moveable plate 12 in the illustrated embodiment has a central portion 24 and a plurality of arms 26 extending from the central portion 24. In particular, the illustrated embodiment has three arms, but it is to be appreciated that alternative numbers of arms may be present in other embodiments. The lifter assembly 10 also includes a base flange 28 and a top cap 30. A plurality of guiding shafts 32 each extend through respective holes of the moveable plate 12 and are operatively coupled to the base flange 28 and the top cap 30. As shown in FIGS. 2-4B, the guiding shafts 32 are located external to, or radially outward of, the bellows structure 22. Each guiding shaft 32 may have threaded ends to engage threaded regions of the base flange 28 and top cap 30. Alternatively, the guiding shafts 32 may be coupled to the base flange 28 and the top cap 30 with nuts or the like. While the bellows structure 22 actuates vertical adjustment of the moveable plate 12, the chuck 14 and the substrate, the guiding shafts 32 guide the vertical movement to maintain adjustment in the vertical direction. The number of the plurality of guiding shafts 32 may vary depending upon the particular application of use.

Figure 3A:
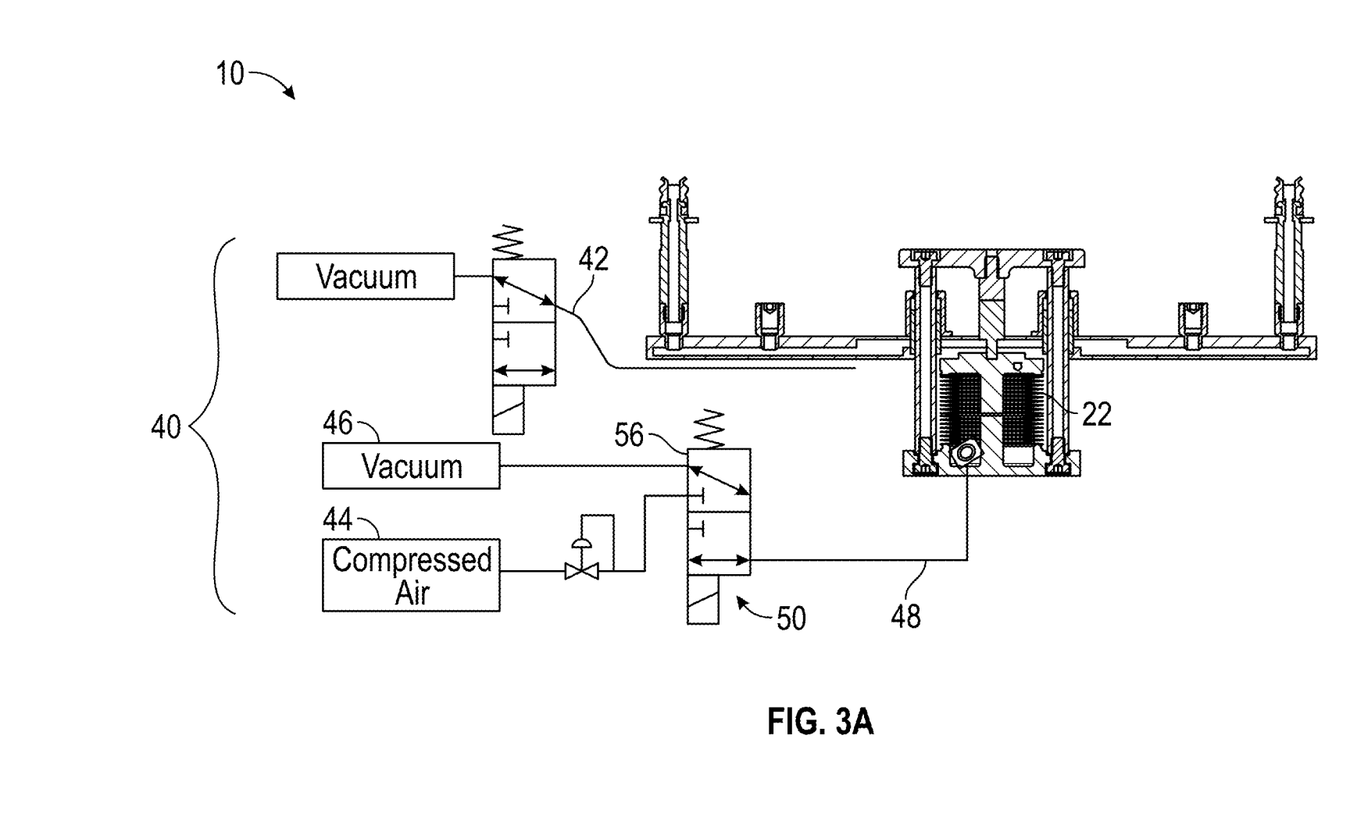
FIG. 3A illustrates the lifter assembly in a retracted position with fluid lines connected thereto.
Figure 3B:
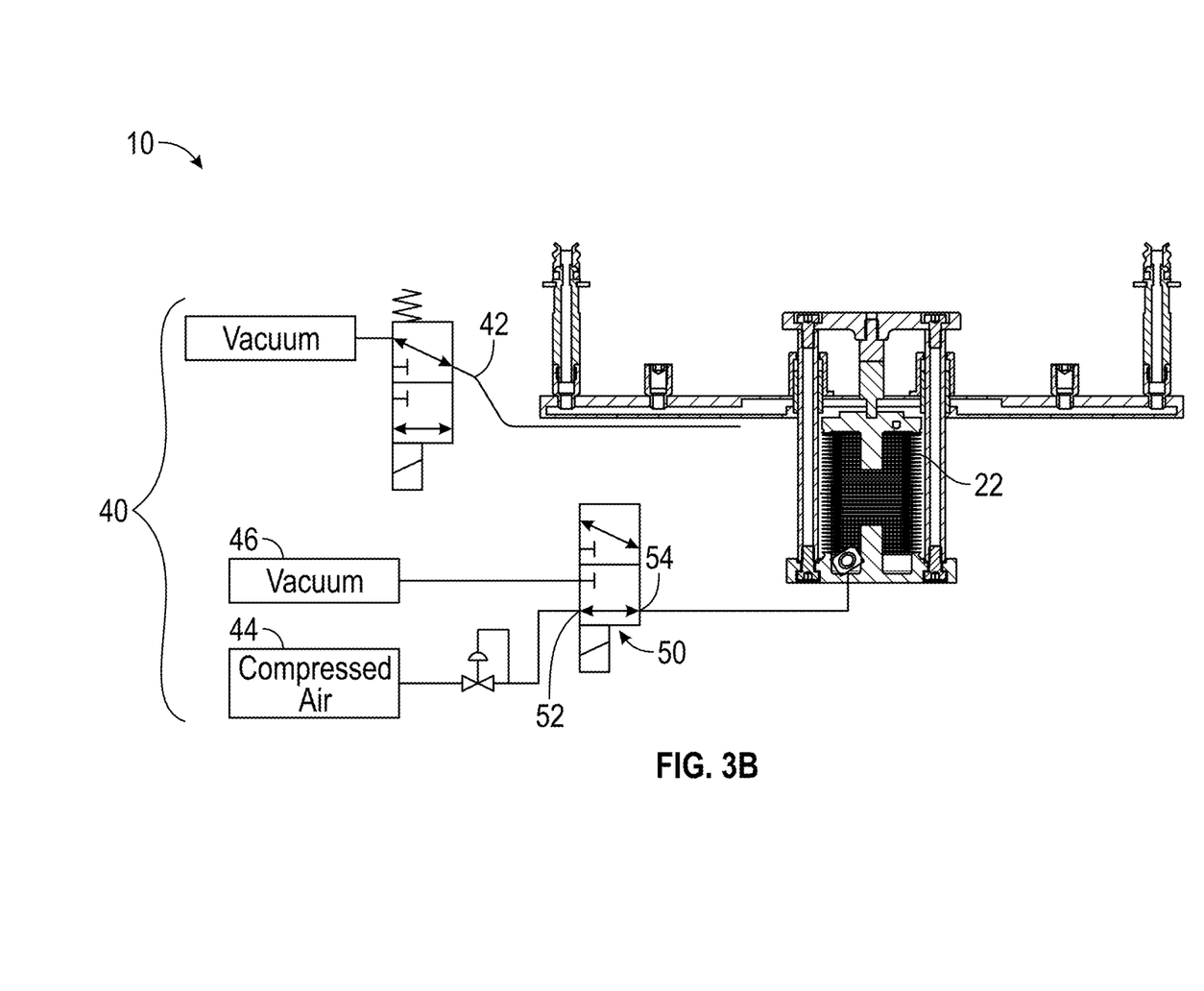
FIG. 3B illustrates the lifter assembly in an extended position with fluid lines connected thereto.

Referring now to FIGS. 3A and 3B, with continued reference to FIG. 2, the lifter assembly 10 is fluidly coupled to a pneumatic system 40. A first fluid connection is made between at least one of the plurality of arms 26 of the moveable plate 12 via a first piping arrangement 42. The first fluid connection provides the vacuum air pressure required to hold the substrate on the chuck 14, as described above. The second fluid connection is made between an interior chamber of the bellows structure 22 and a selectively switchable supply from a compressed air source 44 and a vacuum air pressure source 46 via a second piping arrangement 48. Regarding the second fluid connection, a ported solenoid 50 has an inlet 52 to receive compressed air from the compressed air source 44, an outlet 54 to route the compressed air to the interior chamber of the bellows structure 22, and an exhaust 56 to withdraw compressed air from the interior chamber of the bellows structure 22 with the vacuum air pressure source 46.

The ported solenoid 50 in the illustrated embodiment is a 3-way solenoid, but it is to be appreciated that other types of piping arrangements may be utilized for the second fluid connection to selectively route compressed air into and out of the interior chamber of the bellows structure 22. In the illustrated embodiment of the ported solenoid 50, vacuum air pressure is provided to the bellows structure 22 to contract the bellows structure 22, thereby lowering the moveable plate 12, when the ported solenoid 50 is de-energized. Conversely, upon energization of the ported solenoid 50, compressed air enters the bellows structure 22 through a pressure regulator 58 that is pre-set to a pressure value sufficient to expand the bellows structure 22, thereby lifting the moving mass which includes the moveable plate 12, the chuck 14 and the substrate supported thereon.

Figure 4A:
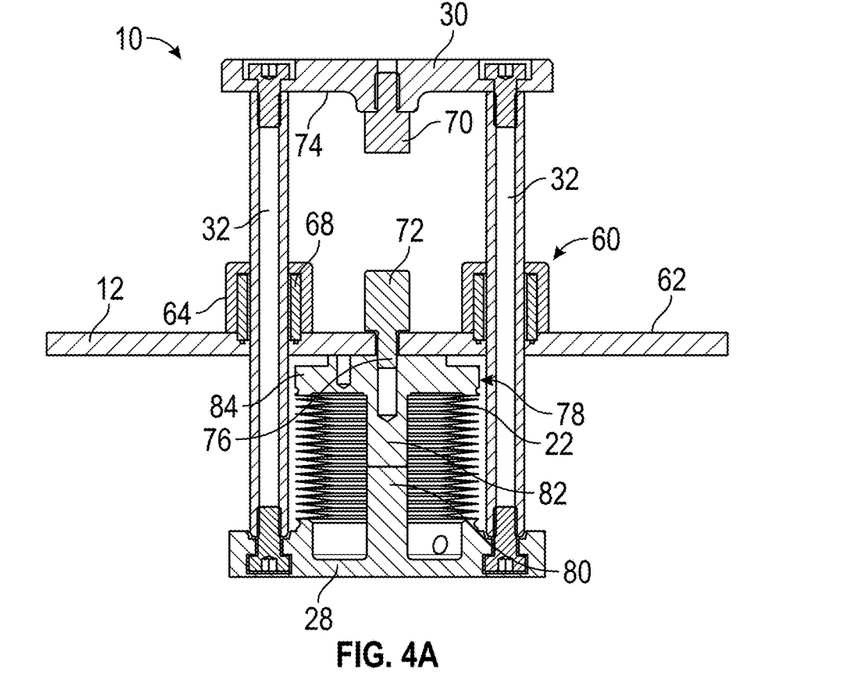
FIG. 4A illustrates the lifter assembly in the retracted position.
Figure 4B:
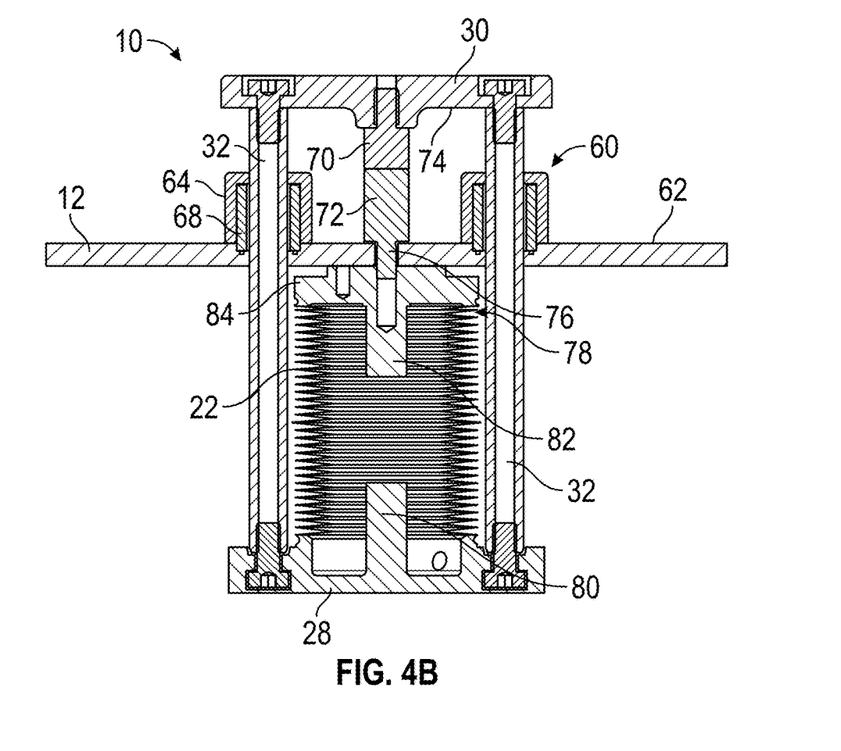
FIG. 4B illustrates the lifter assembly in the extended position.

Referring to FIGS. 4A and 4B, the lifter assembly 10 according to a first embodiment is illustrated in greater detail. The bellows structure 22 is vertically adjustable between a lower, retracted position (FIG. 4A) and an upper, extended position (FIG. 4B) to vertically adjust the moveable plate 12, the chuck 14 and the substrate. As described above, the plurality of guiding shafts 32 extend through respective holes of the moveable plate 12 and are operatively coupled to the base flange 28 and the top cap 30 to guide vertical movement of the moveable plate 12. Stabilization of movement of the moveable plate 12 during vertical translation along the guiding shafts 32 is provided with a plurality of bushing arrangements 60. In particular, the moveable plate 12 has a number of bushing arrangements 60 mounted on an upper surface 62 thereof which corresponds to the number of guiding shafts 32. Therefore, each guiding shaft 32 passes through a respective bushing arrangement 60. Each bushing arrangement 60 includes a bush housing 64 which contains a bushing 68 therein. The bushing arrangements 60 concentrically surround a portion of the guiding shafts 32 and translate with the moveable plate 12.

The lower, retracted position (FIG. 4A) and the upper, extended position (FIG. 4B) of the lifter assembly 10 are defined by respective upper and lower stop structures, as described herein. The disclosed stop structures provide pre-defined limits of vertical travel for the bellows structure 22, the moveable plate 12, the chuck 14 and therefore the substrate held thereon.

The upper, extended position is defined by contact between an upper travel limit feature 70 and an upper stopper 72 operatively coupled to, or integrally formed with, the moveable plate 12. In some embodiments, the upper travel limit feature 70 is integrally formed with the top cap 30 and is part of a lower surface 74 of the top cap 30. In other embodiments, the upper travel limit feature 70 is a component separate from the top cap 30 and is operatively coupled thereto, as illustrated. For example, the upper travel limit feature 70 may be directly threaded to the top cap 30 or coupled thereto with a mechanical fastener. The upper travel limit feature 70 is positioned to be contacted by the upper stopper 72 which extends upwardly from the upper surface 62 of the moveable plate 12. As noted above, the upper stopper 72 may be integrally formed with the moveable plate 12. In embodiments with the upper stopper 72 operatively coupled to the moveable plate 12, the upper stopper 72 may have a coupling segment 76 extending through the moveable plate 12 for threading to the moveable plate 12 or may completely extend through the moveable plate 12 to be coupled to an upper flange 78 disposed below the moveable plate 12. Any of the embodiments disclosed herein results in contact between the upper travel limit feature 70 and the upper stopper 72 to define the upper, extended position of the moveable plate 12.

The lower, retracted position is defined by contact between a lower travel limit feature 80 and a lower stopper 82 operatively coupled to, or integrally formed with, the moveable plate 12. In the illustrated embodiment, the upper flange 78 includes a main body portion 84 disposed between the top of the bellows structure 22 and the moveable plate 12. The upper flange 78 also includes a downwardly protruding portion which is the lower stopper 82 in the illustrated embodiment. The lower stopper 82 is positioned to contact an upwardly protruding portion of the base flange 28 which is the lower travel limit feature 80 in the illustrated embodiment. Contact between the lower stopper 82 and the lower travel limit feature 80 define the lower, retracted position of the moveable plate 12. It is to be appreciated that in alternative embodiments, the lower travel limit feature 80 may be a component which is operatively coupled to the base flange 28 rather than integrally formed therewith. Similarly, the lower stopper 82 may be operatively coupled to the upper flange 78 or the moveable plate 12 in other embodiments.

Figure 5:
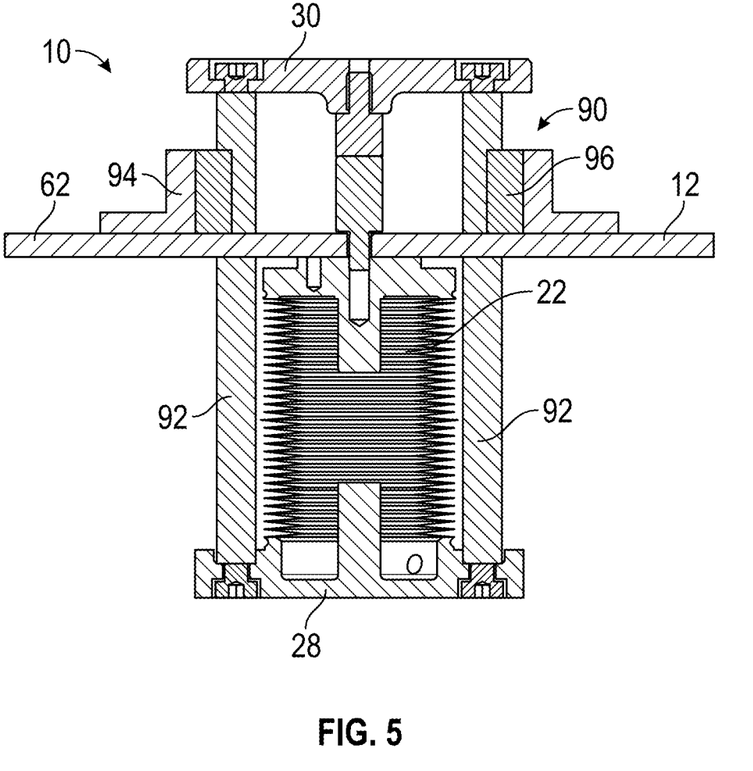
FIG. 5 is a cross-sectional, elevation view of the lifter assembly according to another aspect of the disclosure.

Referring now to FIG. 5, a slider assembly 90 is provided as an alternative to the plurality of guiding shafts 32 and bushing arrangements 60 shown in FIGS. 4A and 4B. The slider assembly 90 includes a plurality of slide rails 92 extending through respective holes defined by the moveable plate 12. Each of the slide rails 92 is operatively coupled to the base flange 28 and the top cap 30. Each sliding rail 92 may have threaded ends to engage threaded regions of the base flange 28 and top cap 30. Alternatively, the sliding rails 92 may be coupled to the base flange 28 and the top cap 30 with nuts or the like. While the bellows structure 22 actuates vertical adjustment of the moveable plate 12, the chuck 14 and the substrate, the sliding rails 92 guide the vertical movement to maintain adjustment in the vertical direction. The number of the plurality of slide rails 92 may vary depending upon the particular application of use.

A plurality of mount plates 94 corresponding to the number of the plurality of slide rails 92 are coupled to the upper surface 62 of the moveable plate 12. Each of the mount plates 94 have a sliding member 96 disposed between the respective mount plate 94 and slide rail 92. Accordingly, during vertical movement of the moveable plate 12, the slider assembly 90 ensures smooth, guided movement of the moveable plate 12.

Figure 6A:
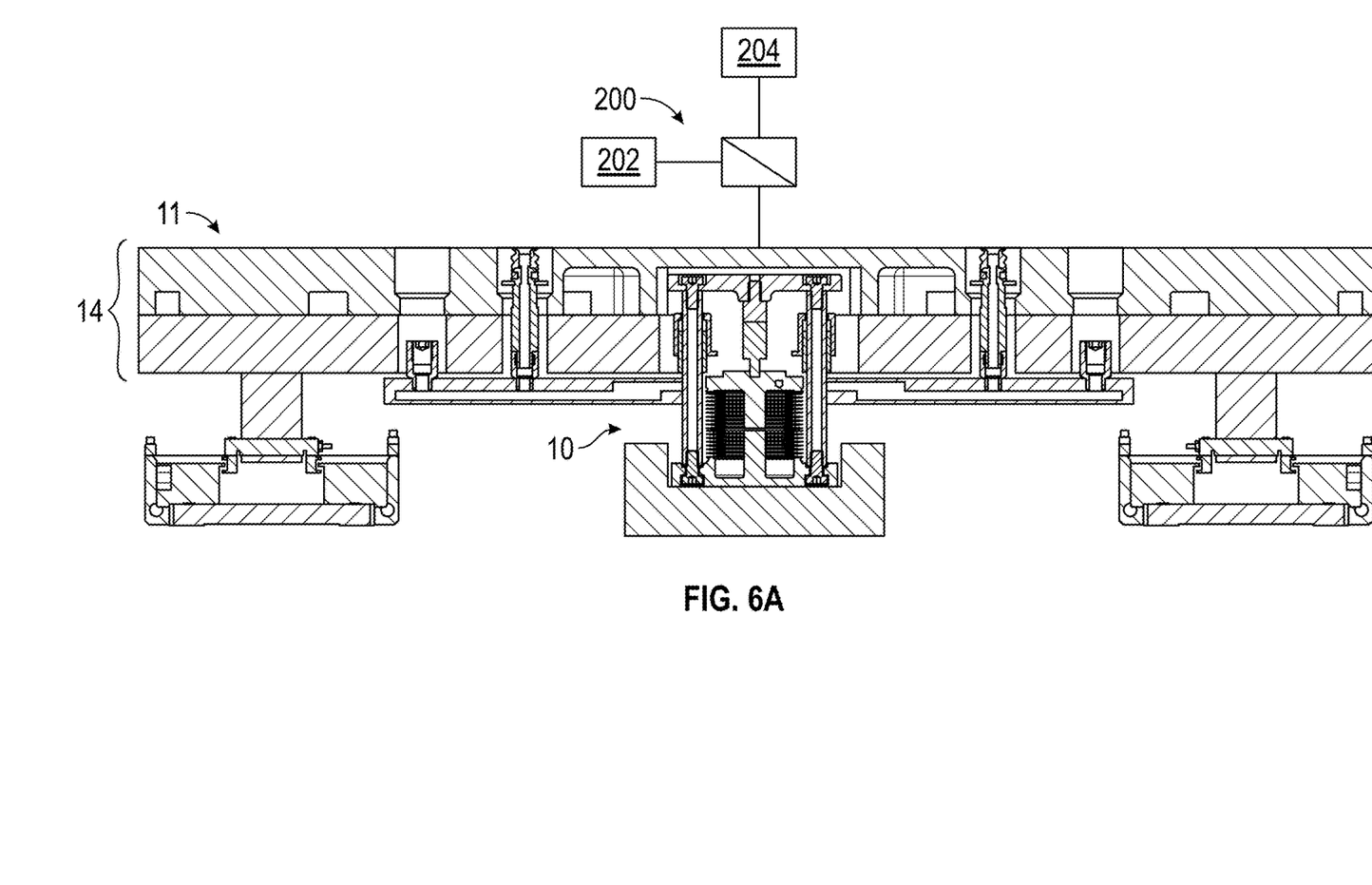
FIG. 6A schematically illustrates an optical system incorporating the embodiments of the lifter assembly disclosed herein according to one aspect of the disclosure.
Figure 6B:
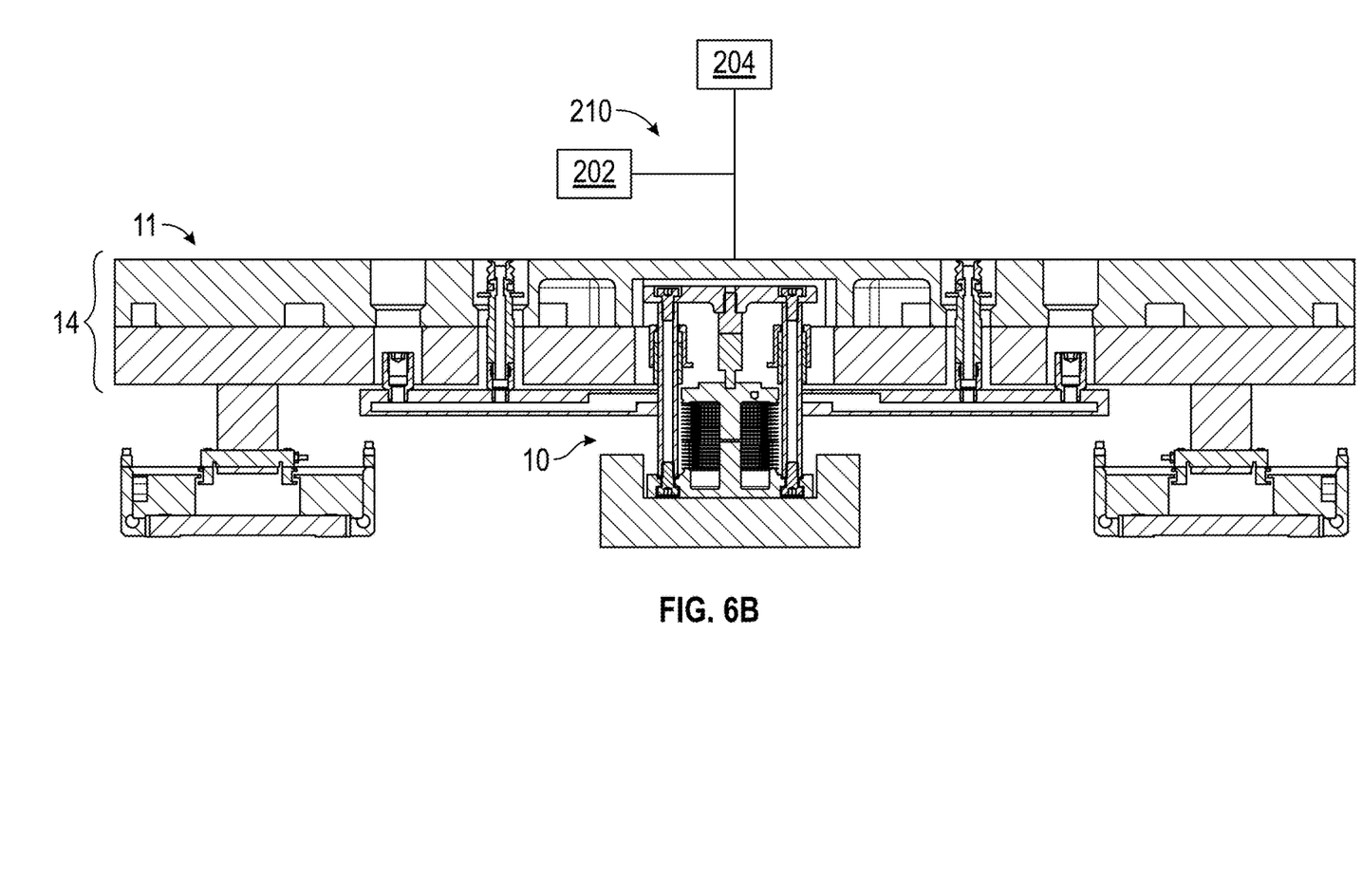
FIG. 6B schematically illustrates an optical system incorporating the embodiments of the lifter assembly disclosed herein according to another aspect of the disclosure.

Referring now to FIGS. 6A and 6B, simplified schematic views of optical systems 200, 210 equipped with the lifter assembly 10 and the chuck 14, as described previously herein are illustrated. In one embodiment, the optical systems 200, 210 further include at least one light source 202 (e.g., one or more lasers, one or more broadband light sources, etc.) configured to illuminate an area on the surface of the substrate. In another embodiment, the optical systems 200, 210 include one or more detectors 204, or cameras, suitable for detecting light reflected, diffracted, or scattered from the area illuminated by the light source 202. In one embodiment, the one or more detectors 204 may include, but are not limited to, a CCD or TDI-CCD detector, or a photomultiplier detector. In addition, the optical systems 200, 210 may include a set of optical elements (e.g., illumination optics, collection optics, beam splitters 206, filters and the like) configured for directing (and focusing) illumination from the light source 202 onto the surface of the substrate and, in turn, directing illumination from the surface of the substrate to the imaging portion of the detector 204 of the optical systems 200, 210. For instance, the set of optical elements for the optical systems 200, 210 may include, but is not limited to, a primary imaging lens suitable for imaging the illuminated area of the substrate onto a collection portion(s) of the detector 204. Further, the imaging detector 204 may be communicatively coupled to an image processing computer which may identify and store imagery data acquired from the detector 204.

The optical systems 200, 210 disclosed herein may be configured as any optical systems known in the art, including, but not limited to inspection systems, metrology systems, and lithography systems. For example, as shown in FIG. 6A, the optical system 200 may be configured as a bright field (BF) inspection system. Alternatively, as shown in FIG. 6B, the optical system 210 may be configured as a dark field (DF) inspection system. It is noted that the optical configurations depicted in FIGS. 6A and 6B are provided merely for illustrative purposes and should not be interpreted as limiting. In a general sense, the optical systems 200, 210 may include any set of imaging and optical elements suitable for imaging the surface of the substrate.

The embodiments disclosed herein provide a lifter assembly 10 that is more compact, relative to other lifting devices. Accordingly, the lifter assembly 10 can fit in smaller overall spaces and may be configured to be used in different optical systems. Additionally, wear and tear on the lifter assembly components is reduced due to the frictionless actuation provided by the bellows structure 22, as this actuation accommodates tilted, cylinder rod rotation and uneven loads.

While the invention has been described in detail in connection with only a limited number of embodiments, it is to be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Moreover, any feature, element, component or advantage of any one embodiment can be used on any of the other embodiments. Accordingly, the invention is not to be seen as limited by the foregoing description.

What is claimed is:

1. A lifter assembly for an optical system, the lifter assembly comprising:
    a chuck comprising a chuck base and a detachable top plate, wherein the detachable top plate is one of a plurality of interchangeable detachable top plates configured to support a substrate;
    a moveable plate supporting the chuck on an upper surface of the moveable plate, the moveable plate vertically adjustable between a lower, retracted position and an upper, extended position;
    a bellows structure operatively coupled to the moveable plate;
    a plurality of guiding shafts extending through holes of the moveable plate to guide vertical adjustment of the moveable plate, the plurality of guiding shafts located external to the bellows structure; and
    a pneumatic system fluidly coupled to the bellows structure to selectively expand and contract, wherein expansion of the bellows structure vertically adjusts the moveable plate to the upper, extended position and contraction of the bellows structure vertically adjusts the moveable plate to the lower, retracted position.

2. The lifter assembly of claim 1, wherein the pneumatic system comprises a solenoid having an inlet port, an outlet port, and an exhaust port, the inlet port fluidly coupled to a compressed air source to selectively provide compressed air through the outlet port and into an interior chamber of the bellows structure to expand the bellow structure, the exhaust port fluidly coupled to a vacuum generating device to withdraw compressed air from the interior chamber of the bellows structure to contract the bellows structure.

3. The lifter assembly of claim 1, further comprising:
    a top cap;
    a base flange; and
    wherein each of the plurality of guiding shafts extending through holes of the moveable plate to guide vertical adjustment of the moveable plate, each of the guiding shafts is operatively coupled to the top cap and to the base flange.

4. The lifter assembly of claim 3, further comprising a stopper projecting upwardly from the upper surface of the moveable plate.

5. The lifter assembly of claim 4, further comprising an upper travel limit feature integrally formed with the top cap, wherein contact between the upper travel limit feature and the stopper operatively define the upper, extended position of the moveable plate.

6. The lifter assembly of claim 4, further comprising an upper travel limit feature operatively coupled to the top cap, wherein contact between the upper travel limit feature and the stopper operatively define the upper, extended position of the moveable plate.

7. The lifter assembly of claim 3, further comprising an upper flange having a main body portion disposed between a top surface of the bellows structure and a lower surface of the moveable plate, the upper flange also having a downwardly protruding portion positioned to contact an upwardly protruding portion of the base flange to define the lower, retracted position of the moveable plate.

8. The lifter assembly of claim 1, further comprising a plurality of bush housings corresponding to the number of the plurality of guiding shafts, each of the bush housings coupled to the moveable plate and having a bushing disposed therein, each bushing concentrically surrounding a respective one of the plurality of guiding shafts.

9. The lifter assembly of claim 1, wherein the bellows structure is a welded bellows structure.

10. The lifter assembly of claim 1, wherein the substrate comprises a semiconductor wafer.

11. An optical system comprising:
    a substrate chucking sub-system having:
        a chuck having a chuck base and a detachable top plate, the detachable top plate configured to support a substrate;
        a moveable plate supporting the chuck on an upper surface of the moveable plate, the moveable plate vertically adjustable between a lower, retracted position and an upper, extended position;
        a bellows structure operatively coupled to the moveable plate, wherein expansion of the bellows structure vertically adjusts the moveable plate to the upper, extended position and contraction of the bellows structure vertically adjusts the moveable plate to the lower, retracted position; and
        a plurality of guiding shafts extending through holes of the moveable plate to guide vertical adjustment of the moveable plate, the plurality of guiding shafts located external to the bellows structure;
    an illumination source configured to illuminate one or more portions of the substrate; and
    a detector configured to collect illumination from the illuminated one or more portions of the substrate.

12. The optical system of claim 11, wherein the optical system is configured as an inspection tool.

13. The optical system of claim 11, wherein the optical system is configured as a metrology tool.

14. The optical system of claim 11, further comprising a pneumatic system fluidly coupled to the bellows structure to selectively expand and contract, wherein expansion of the bellows structure vertically adjusts the moveable plate to the upper, extended position and contraction of the bellows structure vertically adjusts the moveable plate to the lower, retracted position.

15. The optical system of claim 14, wherein the pneumatic system comprises a solenoid having an inlet port, an outlet port, and an exhaust port, the inlet port fluidly coupled to a compressed air source to selectively provide compressed air through the outlet port and into an interior chamber of the bellows structure to expand the bellow structure, the exhaust port fluidly coupled to a vacuum generating device to withdraw compressed air from the interior chamber of the bellows structure to contract the bellows structure.

16. The optical system of claim 11, further comprising:
a top cap;
a base flange; and
wherein each of the plurality of guiding shafts extending through holes of the moveable plate to guide vertical adjustment of the moveable plate, each of the guiding shafts is operatively coupled to the top cap and to the base flange.

* * * * *